(12) United States Patent
Ruehrig et al.

(10) Patent No.: US 7,893,511 B2
(45) Date of Patent: Feb. 22, 2011

(54) INTEGRATED CIRCUIT, MEMORY MODULE, AND METHOD OF MANUFACTURING AN INTEGRATED CIRCUIT

(75) Inventors: Manfred Ruehrig, Eckental (DE); Ulrich Klostermann, Munich (DE); Michael Vieth, Moehrendorf (DE)

(73) Assignee: Qimonda AG, Munich (DE)

( * ) Notice: Subject to any disclaimer, the term of this patent is extended or adjusted under 35 U.S.C. 154(b) by 274 days.

(21) Appl. No.: 12/175,236

(22) Filed: Jul. 17, 2008

(65) Prior Publication Data

US 2010/0013035 A1 Jan. 21, 2010

(51) Int. Cl.
*H01L 29/82* (2006.01)

(52) U.S. Cl. ............... 257/427; 257/421; 257/E43.001; 257/E43.006; 438/48; 365/158

(58) Field of Classification Search ................. 257/427, 257/421, E43.001, E43.006; 438/48; 365/158
See application file for complete search history.

(56) References Cited

U.S. PATENT DOCUMENTS

| 5,793,697 | A  | * | 8/1998  | Scheuerlein    | 365/230.07 |
| 2004/0196704 | A1 | * | 10/2004 | Andrei et al.  | 365/200    |
| 2005/0110004 | A1 | * | 5/2005  | Parkin et al.  | 257/30     |
| 2007/0228501 | A1 | * | 10/2007 | Nakamura et al.| 257/421    |

* cited by examiner

*Primary Examiner*—Tu-Tu V Ho
(74) *Attorney, Agent, or Firm*—John S. Economou (57) ABSTRACT

An integrated circuit includes a plurality of magnetic tunneling junction stacks, each magnetic tunneling junction stack including a reference layer, a barrier layer and a free layer, wherein the plurality of magnetic tunneling junction stacks share a continuous common reference layer.

13 Claims, 11 Drawing Sheets

| Model | Barrier conduct. [S/m] | Barrier R*A [Ohm*µm²] 2nm thickness | Pinned layer conduct. [S/m] 2nm thickness | PINNING LAYER NAF conduct. [S/m] | NAF thickness [nm] | % current in neighbor | Lamda 1) |
|---|---|---|---|---|---|---|---|
| 70714/_2 | 2000/1000 | 1.0/2.0 | 1000000 | 100000 | 12 | 74.8 | 56.6 |
| 70804/_2 | 10000/8000 | 0.2/0.24 | 210000 | 100000 | 12 | 35.8 | 18.1 |
| 70810/_2 | 50000/40000 | 0.040/0.048 | 210000 | 100000 | 12 | 26.4 | 8.3 |
| 70812/_2 | 100000/80000 | 0.020/0.024 | 210000 | 100000 | 12 | 25.6 | 6.0 |
| 70814/_2 | 100000/80000 | 0.020/0.024 | 210000 | 100000 | 8 | 19.7 | 5.3 |
| 70814/_4 | 100000/50000 | 0.020/0.040 | 210000 | 100000 | 8 | = | = |
| 70814/_8 | 100000/120000 | 0.020/0.0166 | 210000 | 100000 | 8 | = | = |
| 70814/_9 | 100000/140000 | 0.020/0.014 | 210000 | 100000 | 8 | = | = |

INTEGRATED CIRCUIT, MEMORY MODULE, AND METHOD OF MANUFACTURING AN INTEGRATED CIRCUIT

TECHNICAL FIELD

The present invention relates generally to an integrated circuit, a memory module, and a method of manufacturing an integrated circuit.

BACKGROUND

Integrated circuits including magneto-resistive memory cells are known. A magneto-resistive memory cell generally includes a memory element comprising a reference layer, a barrier layer, and a free layer which are stacked above each other in this order. Each of the reference layer, the barrier layer, and the free layer may comprise multiple sublayers. It is becoming more and more difficult to manufacture integrated circuits of high reproducibility due to the increased memory density of the magneto-resistive memory cells.

Figure 1:
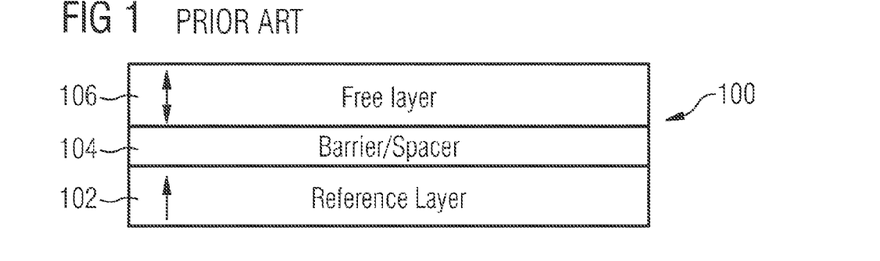
FIG. 1 shows a schematic cross-sectional view of a first manufacturing stage of a conventional method of manufacturing an integrated circuit.

FIG. 1 shows a first manufacturing stage 100 of a conventional method of manufacturing an integrated circuit having a plurality of magneto-resistive memory cells. The manufacturing stage 100 is obtained after having stacked a reference layer 102, a barrier layer 104 and a free layer 106 in this order above each other.

Figure 2:
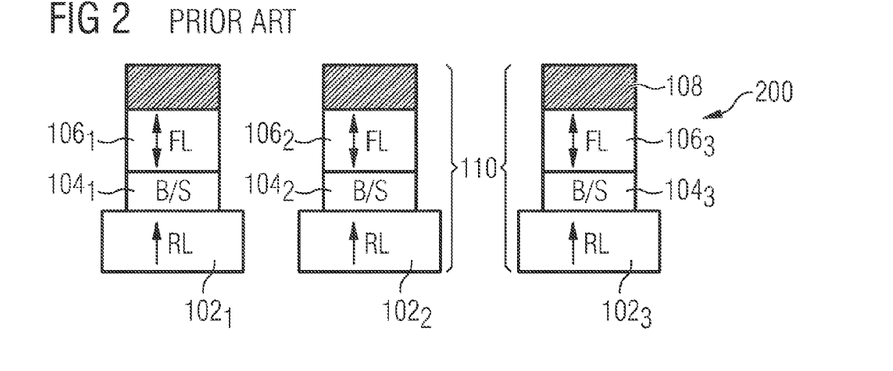
FIG. 2 shows a schematic cross-sectional view of a second manufacturing stage of a conventional method of manufacturing an integrated circuit.

FIG. 2 shows a conventional manufacturing stage 200 obtained after having deposited a masking layer 108 on the free layer 106. The masking layer 108 has been patterned. Further, the patterned masking layer 108 has been used in order to pattern the free layer 106, the barrier layer 104, and the reference layer 102 into magnetic tunneling junction stacks 110 which are laterally separated against each other, i.e., the full stack of layers shown in FIG. 1 has been patterned. Each magnetic tunneling junction stack 110 can be interpreted as a memory element of a magneto-resistive memory cell.

Figure 3:
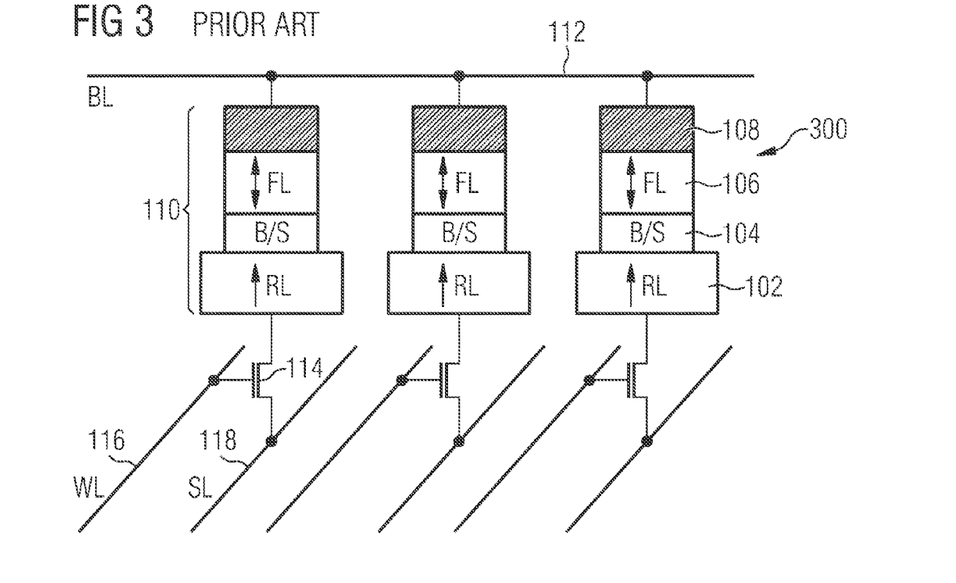
FIG. 3 shows a schematic drawing of a conventional integrated circuit obtained by the manufacturing method shown in FIGS. 1 and 2.

The magnetic tunneling junction stacks 110 thus obtained may be electrically connected as shown in FIG. 3. That is, the top end of each magnetic tunneling junction (MTJ) stack 110 is connected to a bit line 112, and the bottom end of each magnetic tunneling junction stack 110 is connected to a select device 114. Here, it is assumed that the select device 114 is a field effect transistor, the gate of which being connected to a word line 116, the source of which being connected to a source line 118, and the drain of which being connected to the bottom end of the magnetic tunneling junction stack 110. Here, it is assumed that the masking layer 108 is conductive (i.e., it is not removed after the patterning process).

Figure 4:
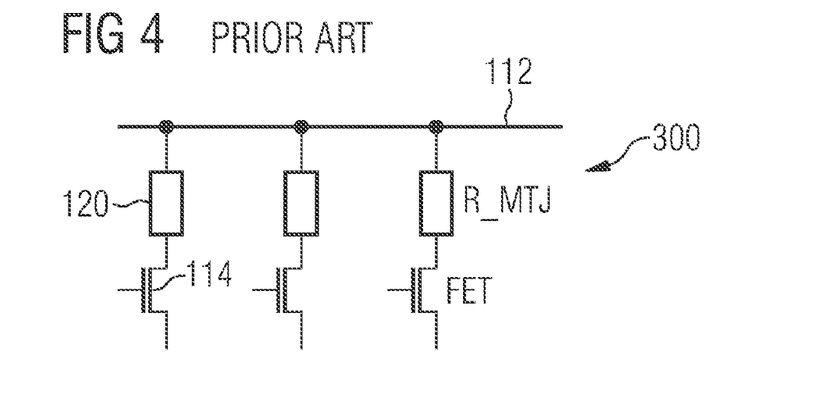
FIG. 4 shows the equivalent circuit of the integrated circuit shown in FIG. 3.

FIG. 4 shows the equivalent circuit of the integrated circuit shown in FIG. 3. As can be derived from FIG. 4, each magnetic tunneling junction stack can be represented by a resistance 120.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION OF ILLUSTRATIVE EMBODIMENTS

Figure 5:
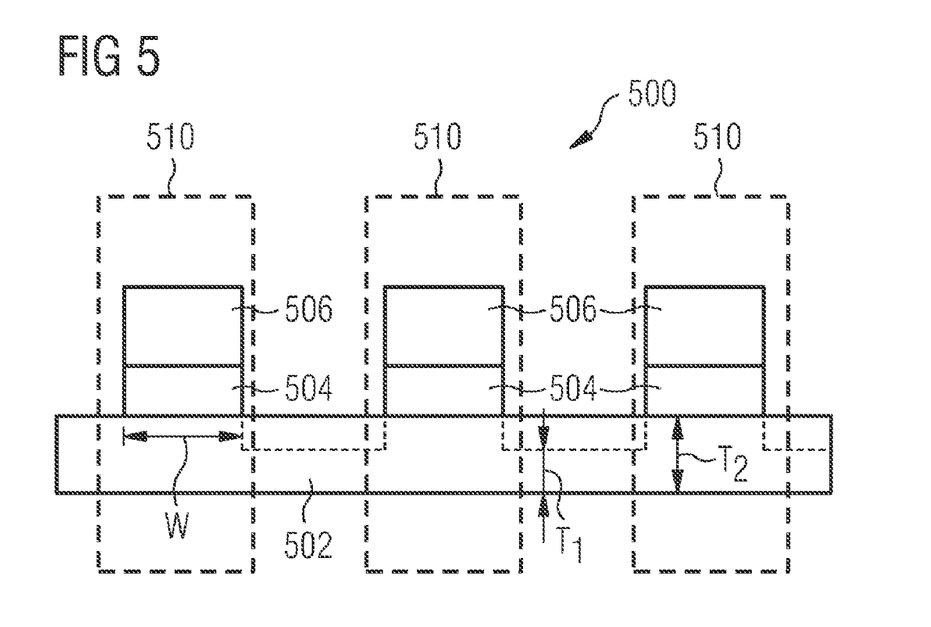
FIG. 5 shows a schematic cross-sectional view of an integrated circuit according to one embodiment of the present invention.

FIG. 5 shows an integrated circuit 500 according to one embodiment of the present invention. The integrated circuit 500 includes a plurality of magnetic tunneling junction stacks 510, each magnetic tunneling junction stack 510 including a part of a continuous common reference layer 502, a barrier layer 504, and a free layer 506 which are stacked above each other in this order. Each of the reference layer 502, the barrier layer 504 and the free layer 506 may respectively include a plurality of sublayers. The barrier layers 504 as well as the free layers 506 may be laterally separated against each other. In contrast, the continuous common reference layer 502 may be shared by all magnetic tunneling junction stacks 510.

One effect of the integrated circuit 500 is that the magnetic tunneling junction stacks 510 can be manufactured with higher reproducibility than the magnetic tunneling junction stacks 110 of the integrated circuit 300 shown in FIG. 3. This, in particular, holds true if the lateral dimensions of the magnetic tunneling junction stacks 510 are very small, for example, if the width W of the magnetic tunneling junction stacks ranges between about 10 and about 15 nm: since the reference layer 502 is not patterned, the duration within which the barrier layer 504 is exposed to the patterning substance can be lowered. As a consequence, possible etching damages of the barrier layer 504 (which decrease the reproducibility of the electrical properties of the magnetic tunneling junction stacks 510) can be kept within defined tolerance ranges. In contrast, in order to manufacture the magnetic tunneling junction stacks 110 of the conventional integrated circuit 300 shown in FIG. 3, the barrier layer 104 is exposed to patterning chemistry for a longer period of time since the whole reference layer 102 has to be patterned. As a consequence, the risk of patterning damage when manufacturing integrated circuit 500 is lower than when manufacturing the conventional integrated circuit 300. The same arguments can also be applied to the free layer 506 (a reduced exposure time of the free layer 506 to etching chemistry reduces possible etching damage).

According to one embodiment of the present invention, the lateral electrical resistance of the continuous common reference layer 502 between two neighboring memory elements (i.e., between two neighboring barrier layers 504) is higher than the vertical resistance between the top surface of the continuous common reference layer 502 and the bottom surface of the continuous common reference layer 502.

In order to achieve this, the continuous common reference layer 502 may, for example, have a reduced thickness between the magnetic tunneling junction stacks 510, as indicated by the dotted lines in FIG. 5. That is, a first thickness T1 of the continuous common reference layer 502 between two neighboring magnetic tunneling junction stacks 510 is reduced, compared to a second thickness T2 of the continuous common reference layer 502 within the area of the magnetic tunneling junction stacks 510.

Figure 6:
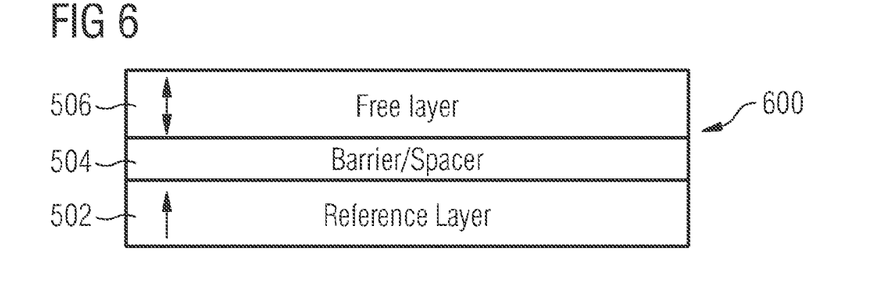
FIG. 6 shows a schematic cross-sectional view of a first manufacturing stage of a method of manufacturing an integrated circuit according to one embodiment of the present invention.

FIG. 6 shows a manufacturing stage 600 of manufacturing an integrated circuit according to one embodiment of the present invention. The manufacturing stage 600 is identical to the conventional manufacturing stage 100 shown in FIG. 1.

Figure 7:
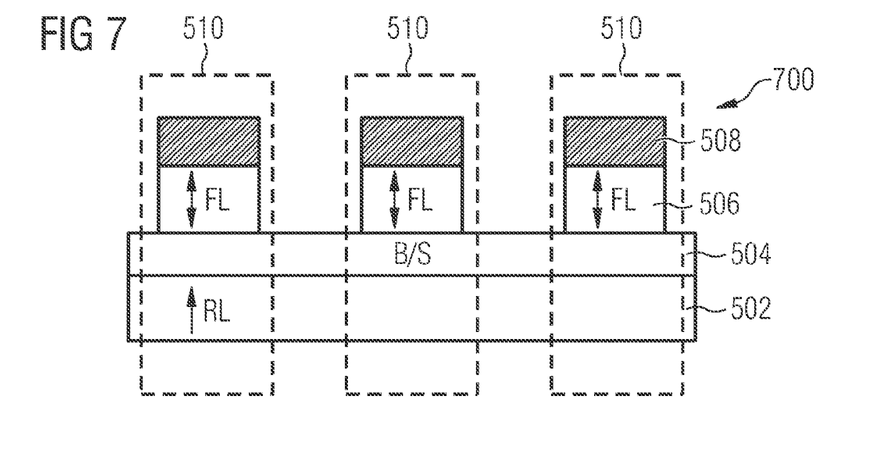
FIG. 7 shows a schematic cross-sectional view of a second manufacturing stage of a method of manufacturing an integrated circuit according to one embodiment of the present invention.

FIG. 7 shows a manufacturing stage 700 obtained after having patterned the stack of layers shown in FIG. 6 down to the top surface of the barrier layer 504. In order to pattern the stack of layers, similar as described in conjunction with FIG. 2, a masking layer (for example, a hard mask layer 508) is formed on the top surface of the free layer 506. Then, the mask layer 508 is patterned. After this, the patterned mask layer 508 is used to pattern the free layer 506. The patterning of the mask layer 508 and the free layer 506 may, for example, be carried out using lithographic processes/etching processes.

In this way, an integrated circuit is obtained in which all magnetic tunneling junction stacks 510 together share a continuous common barrier layer 504. Further, all magnetic tunneling junction stacks 510 together share a continuous common reference layer 502.

According to one embodiment of the present invention, the lateral electrical resistance of the continuous common barrier layer 504 between two neighboring memory cells 502 is lower than the vertical electrical resistance between the top surface of the continuous common barrier layer 504 and the bottom surface of the continuous common barrier layer 504.

After having patterned the free layer 506, the space between the different free layers 506 and the mask layers 508 may be filled with material which is magnetically inactive or only weakly active, for example, isolation material like silicon oxide.

Figure 8:
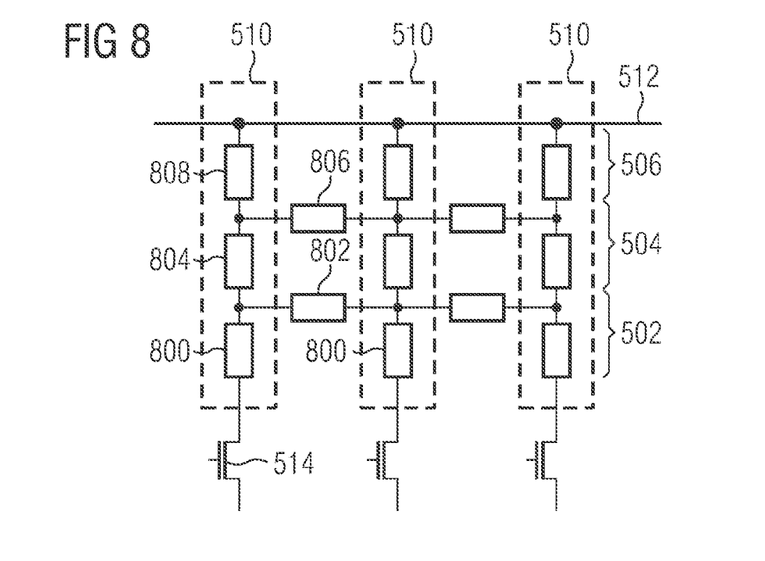
FIG. 8 shows the equivalent circuit of an integrated circuit obtained by the manufacturing method shown in FIGS. 6 and 7.

The equivalent circuit of the integrated circuit shown in FIG. 7 is shown in FIG. 8. In FIG. 8, the vertical electrical resistance of the continuous common reference layer 502 is denoted by reference numeral 800, whereas the lateral electrical resistance through continuous common reference layer 502 is denoted by reference numeral 802. The vertical electrical resistance of the continuous common barrier layer 504 is denoted by reference numeral 804, whereas the lateral electrical resistance of the continuous common barrier layer 504 is denoted by reference numeral 806. The vertical electrical resistance of the free layer 506 is denoted by reference numeral 808.

Figure 9:
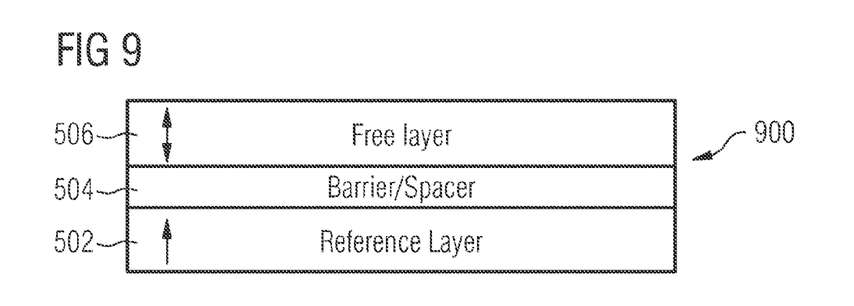
FIG. 9 shows a schematic cross-sectional view of a first manufacturing stage of a method of manufacturing an integrated circuit according to one embodiment of the present invention.

FIG. 9 shows a manufacturing stage 900 which is identical to the manufacturing stage 600 shown in FIG. 6.

Figure 10:
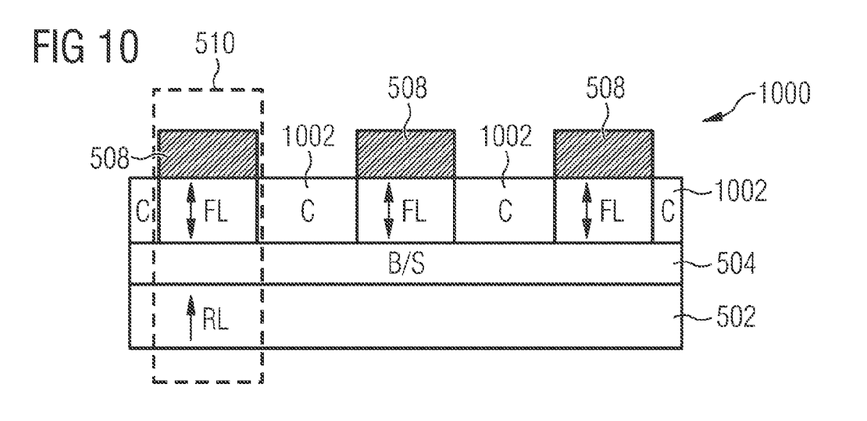
FIG. 10 shows a schematic cross-sectional view of a second manufacturing stage of a method of manufacturing an integrated circuit according to one embodiment of the present invention.

FIG. 10 shows a manufacturing stage 1000 obtained after having patterned the stack of layers shown in FIG. 9 down to the top surface of the barrier layer 504. In order to pattern the stack of layers, a mask layer 508 is formed on the free layer 506. Then, the mask layer 508 is patterned. After this, the patterned mask layer 508 is used to pattern the free layer 506. However, in contrast to manufacturing stage 700 obtained by removing material between the magnetic tunneling junction stacks 510, manufacturing stage 1000 is obtained by changing the material properties of material located between the magnetic tunneling junction stacks 510. That is, the material is not removed, but only changed in its properties. The material 1002 may, for example, be material which is magnetically inactive or only weakly active. The conversion process which converts the material parameters of the material 1002 may, for example, be carried out using an oxidation process, a nitridation process, or a fluoration process. The material 1002 may, for example, have a lower electrical resistance than the material of the free layer 506.

Figure 11:
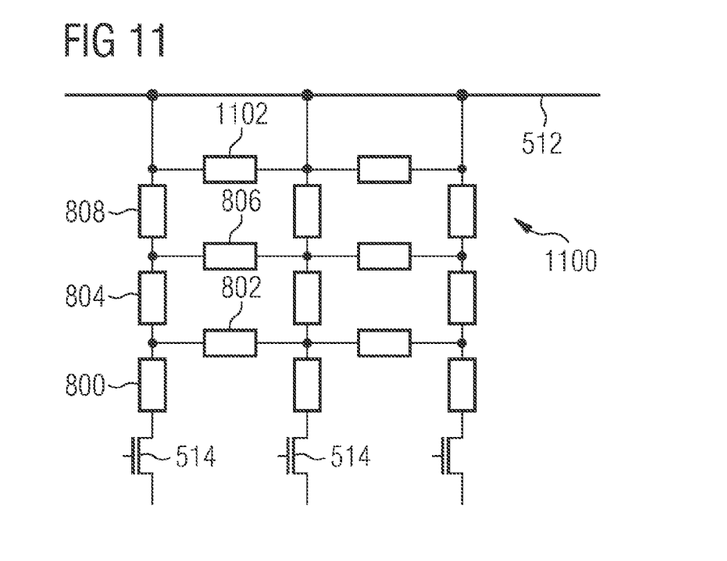
FIG. 11 shows the equivalent circuit of an integrated circuit obtained by the manufacturing method shown in FIGS. 6 and 7.

The equivalent circuit of the integrated circuit shown in FIG. 10 is shown in FIG. 11. A lateral resistance of the material 1002 between two neighboring magnetic tunneling junction stacks 510 is denoted by reference numeral 1102.

Figure 12:
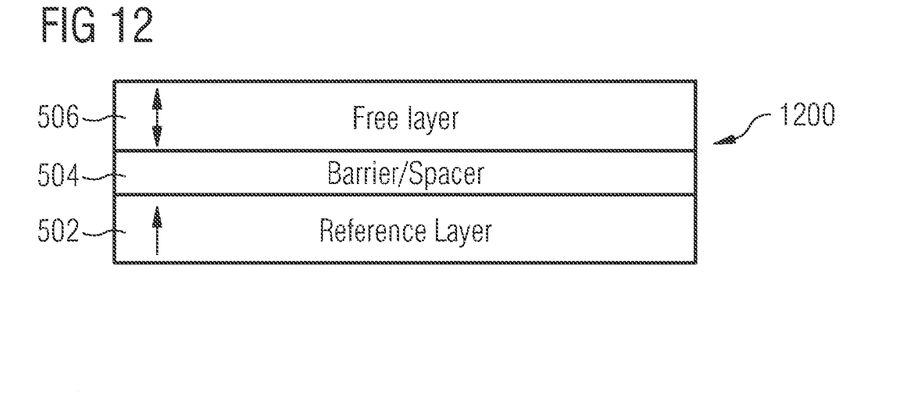
FIG. 12 shows a schematic cross-sectional view of a first manufacturing stage of a method of manufacturing an integrated circuit according to one embodiment of the present invention.

FIG. 12 shows a manufacturing stage 1200 being identical to the manufacturing stage 900 shown in FIG. 9.

Figure 13:
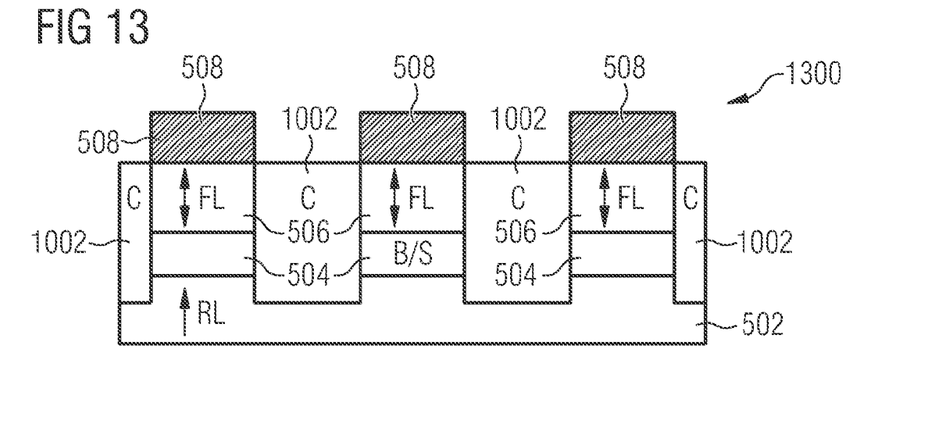
FIG. 13 shows a schematic cross-sectional view of a second manufacturing stage of a method of manufacturing an integrated circuit according to one embodiment of the present invention.

FIG. 13 shows a manufacturing stage 1300 obtained after having patterned the stack of layers shown in FIG. 12. The patterning of the stack of layers is done in the same way as described in conjunction with FIG. 10. However, in contrast to manufacturing stage 1000, manufacturing stage 1300 is obtained after having patterned the stack of layers further down into an upper part of the continuous common reference layer 502. That is, not the whole reference layer 502, but only an upper part of the reference layer 502 is patterned.

One effect of this embodiment is that on the one hand it is ensured that the whole barrier layer 504 is patterned, on the other hand it is ensured that the patterning exposure time of the barrier layer 504 is as short as possible.

Figure 14:
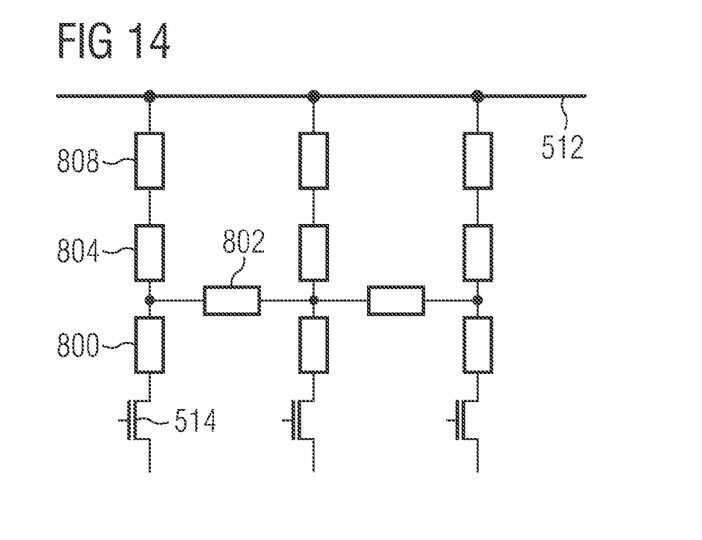
FIG. 14 shows the equivalent circuit of an integrated circuit obtained by the manufacturing method shown in FIGS. 6 and 7.

The equivalent circuit of the integrated circuit shown in FIG. 13 is shown in FIG. 14. A lateral resistance of the continuous common reference layer 502 between two neighboring magnetic tunneling junction stacks 510 is denoted by reference numeral 802. It is assumed here that the resistance of the material 1002 is very high.

Figure 15:
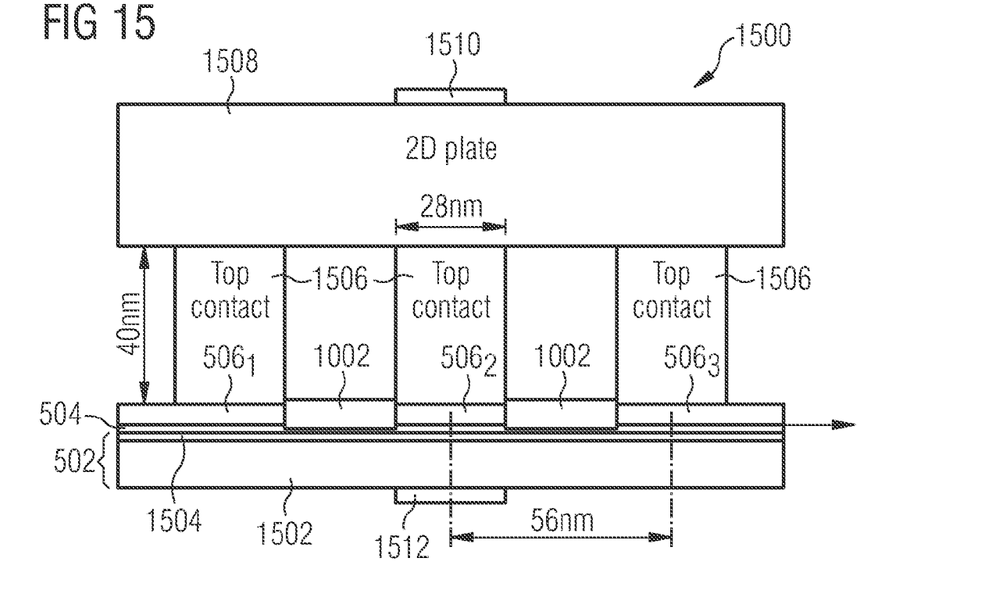
FIG. 15 shows a schematic cross-sectional view of an integrated circuit according to one embodiment of the present invention.

FIG. 15 shows a schematic cross-sectional view of an integrated circuit 1500 according to one embodiment of the present invention. The integrated circuit includes a reference layer 502 including a natural antiferromagnetic layer like a PtMn layer 1502 and a pinned layer 1504 formed on the natural antiferromagnetic layer 1502 which may, for example, be a CoFe layer. On the pinned layer 1504, a barrier layer 504 is formed. On the barrier layer 504, a free layer 506 is formed. The free layer 506 is divided into several free sublayers $506_1$ to $506_3$ spaced apart from each other by magnetically inactive or only weakly active material 1002. The material 1002 reaches from the top surface of the free layer 506 down to the top surface of the barrier layer 504. Each free sublayer $506_1$ to $506_3$ is contacted from above by a contacting element 1506, wherein the contacting elements 1506 are contacted by a two-dimensional conductive plate 1508. It is assumed that current is routed through the integrated circuit 1500 from a first current supply terminal 1510 to a second current supply terminal 1512. The free sublayer $506_2$ is therefore completely laterally separated against eight neighboring free sublayers. It is assumed that the reference layer 502 and the barrier layer 504 have a length and width of respectively about 168 nm. Further, it is assumed that the width of a top contact 1506 is about 28 nm, the height of a top contact 1506 is about 40 nm, and that a distance D between the midpoints of two neighboring top contacts 1506 is about 56 nm.

Figure 17:
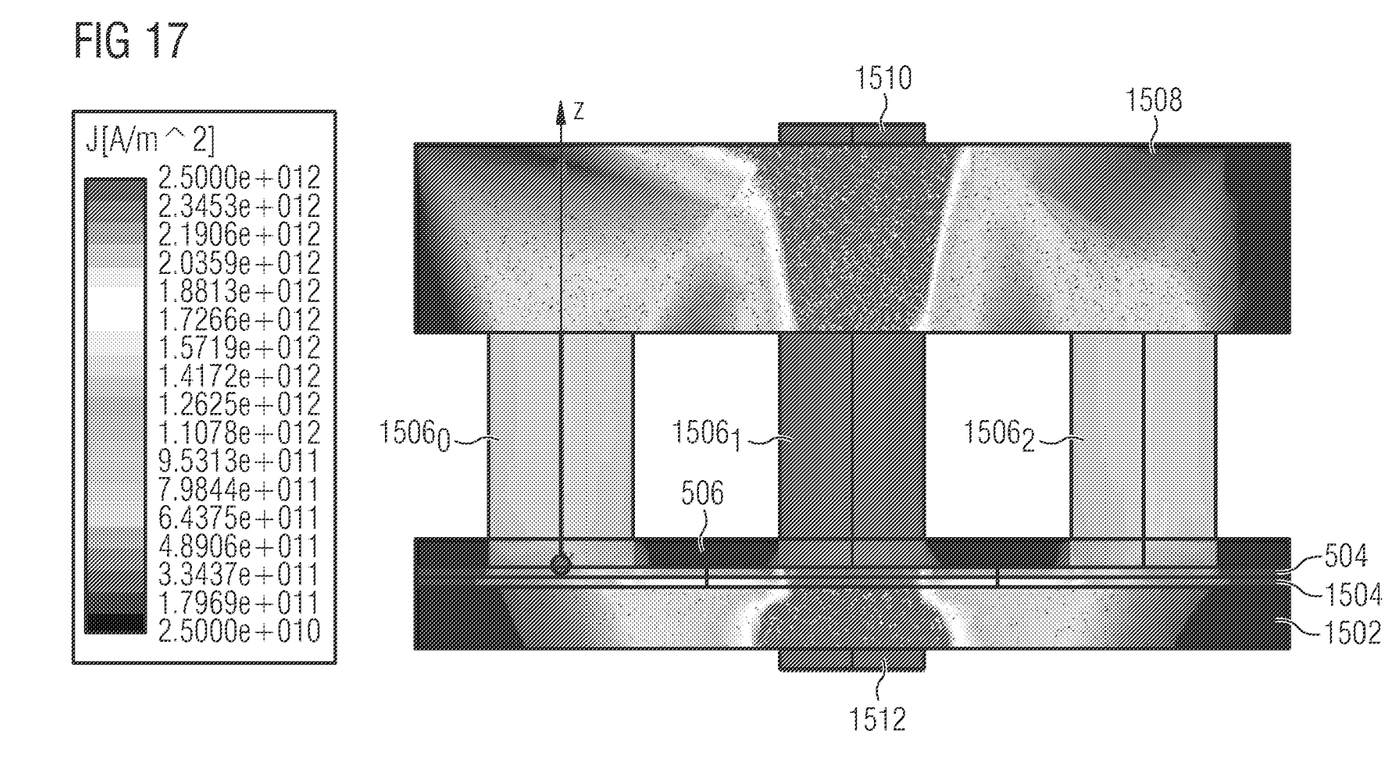
FIG. 17 shows a simulated current flow through the integrated circuit shown in FIGS. 15 and 16.

FIG. 17 shows a color coded current distribution of the current flowing between the first current supply terminal 1510 and the second current supply terminal 1512.

Figure 16:
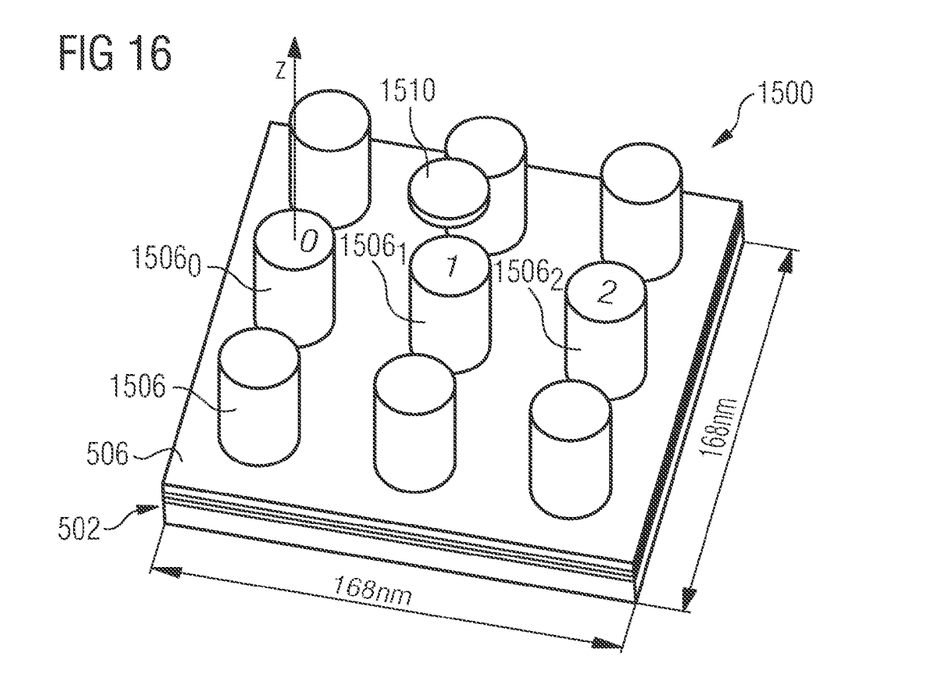
FIG. 16 shows a schematic perspective view of the integrated circuit shown in FIG. 15.
Figure 18:
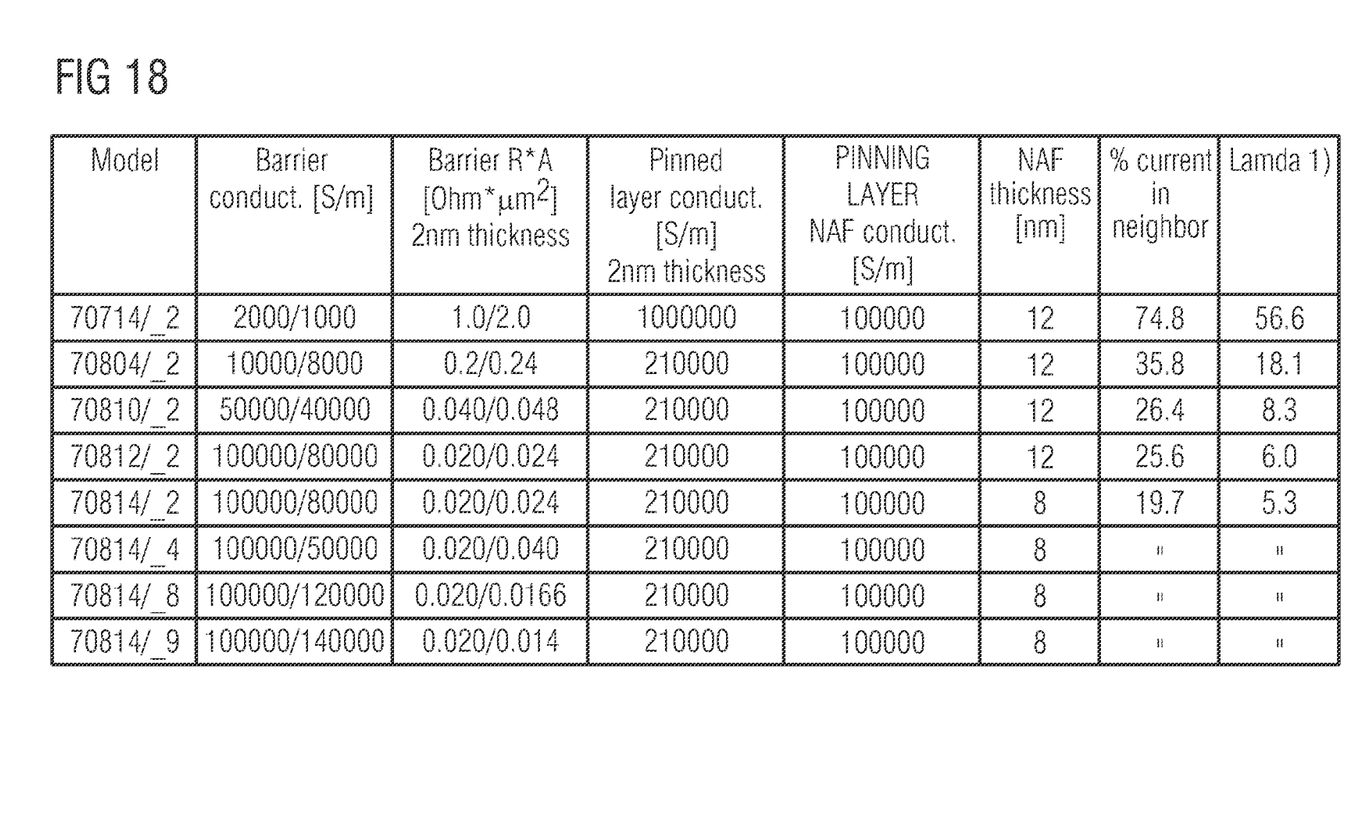
FIG. 18 shows simulation results of the simulation shown in FIG. 17.

FIG. 18 shows a summary of various simulated models. The first column indicates the model name. The second column discloses the barrier conductance of the barrier layer 504 for the anti-parallel (high) resistance state (left number) and the parallel (low) resistance state (right number), assuming that the different magnetization states can be expressed in different resistivity values using the simulation model. The third column discloses the corresponding area resistance for the two states (left number: high resistance state; right number: low resistance state). The fourth column discloses the sheet resistance of the pinned layer (layer 1504). The fifth layer indicates the sheet resistance of the natural antiferromagnet layer (NAF) (layer 1502), and the sixth column the thickness of layer 1502. The parameters of columns 1 to 5 have been used as a basis for a numerical simulation to calculate the amount of current flowing through each of the nine contacting elements 1506 (pillars) of the integrated circuit 1500 as shown in FIG. 16 (model), assuming that a fixed voltage is applied to the terminals 1510 and 1512, respectively. Column 7 gives the percentage of current flowing through the first neighbor of the central contacting element $1506_1$ (i.e., for example, through the contacting element $1506_0$), compared to the current flowing through the central contacting element $1506_1$, assuming the same resistivity state in all nine contacting elements 1506. The results of different simulations collected in column 7 indicate that a corresponding choice of resistivity for the different stack layers (stack of layers 1502, 1504, and 504) can reduce the percentage of current though the next neighbors to less than 20%, for the parameters given in model "70814/_2". The last column finally gives a different view of the result, by calculating a figure of merit of the concept defined as Lambda=sqrt(RA (barrier)/Rbox), wherein Rbox is the lateral resistance of the stack of layers comprising the layers 1502, 1504, and 104. Low values of Lambda indicate that the lateral resistivity of the examined stack of layers 1502, 1504, and 504 is increased in comparison to the barrier resistivity through the barrier layer 504, due to the chosen resistivity parameters of the layer stack only. For low lambda values most of the current is flowing not laterally, but through the barrier into the top contact.

In the embodiments described in FIGS. 5 to 17, it has been assumed that the magnetic tunneling junction stacks 510 are used as memory elements of memory cells. However, alternatively, the magnetic tunneling junction stacks 510 may also be used as sensors: a magnetic field to be detected causes the free layers to adopt particular magnetization directions which can be read out using a sensing current. In this way, the magnetization directions reflect the magnetic field to be detected.

Figure 19A:
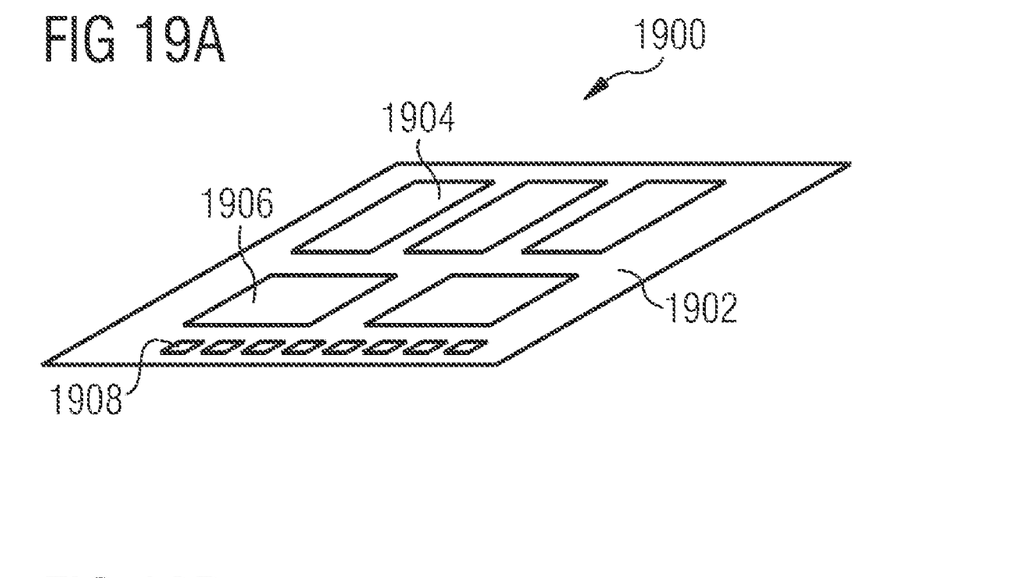
FIGS. 19A and 19B show memory modules according to one embodiment of the present invention.
Figure 19B:
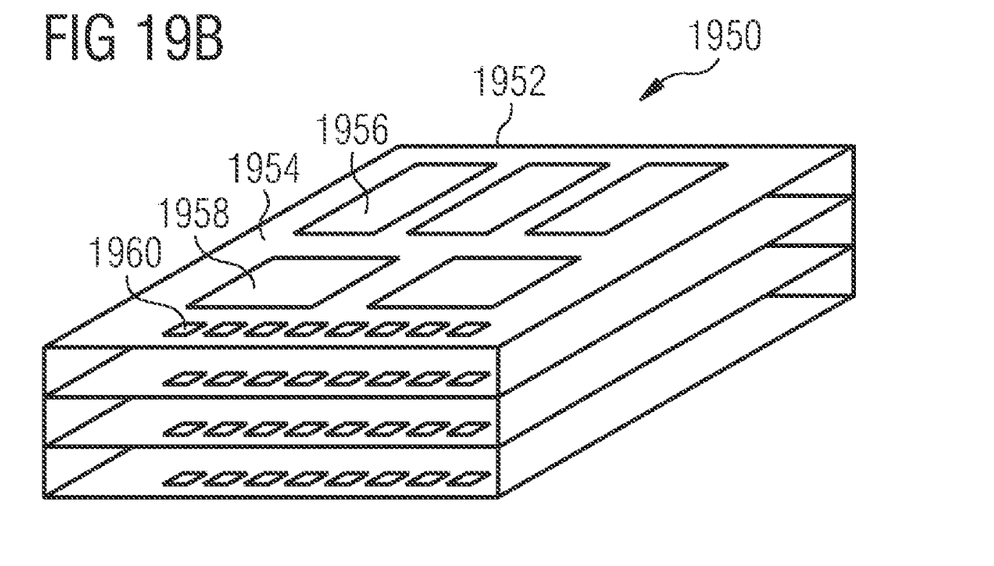

As shown in FIGS. 19A and 19B, in some embodiments, integrated circuits such as those described herein may be used in modules. In FIG. 19A, a memory module 1900 is shown, on which one or more integrated circuits 1904 are arranged on a substrate 1902. The memory module 1900 may also include one or more electronic devices 1906, which may include memory, processing circuitry, control circuitry, addressing circuitry, bus interconnection circuitry, or other circuitry or electronic devices that may be combined on a module with a memory device, such as the integrated circuits 1904. Additionally, the memory module 1900 includes multiple electrical connections 1908, which may be used to connect the memory module 1900 to other electronic components, including other modules.

As shown in FIG. 19B, in some embodiments, these modules may be stackable, to form a stack 1950. For example, a stackable memory module 1952 may contain one or more integrated circuits 1956, arranged on a stackable substrate 1954. The stackable memory module 1952 may also include one or more electronic devices 1958, which may include memory, processing circuitry, control circuitry, addressing circuitry, bus interconnection circuitry, or other circuitry or electronic devices that may be combined on a module with a memory device, such as the integrated circuits 1956. Electrical connections 1960 are used to connect the stackable memory module 1952 with other modules in the stack 1950, or with other electronic devices. Other modules in the stack 1950 may include additional stackable memory modules, similar to the stackable memory module 1952 described above, or other types of stackable modules, such as stackable processing modules, control modules, communication modules, or other modules containing electronic components.

Figure 20:
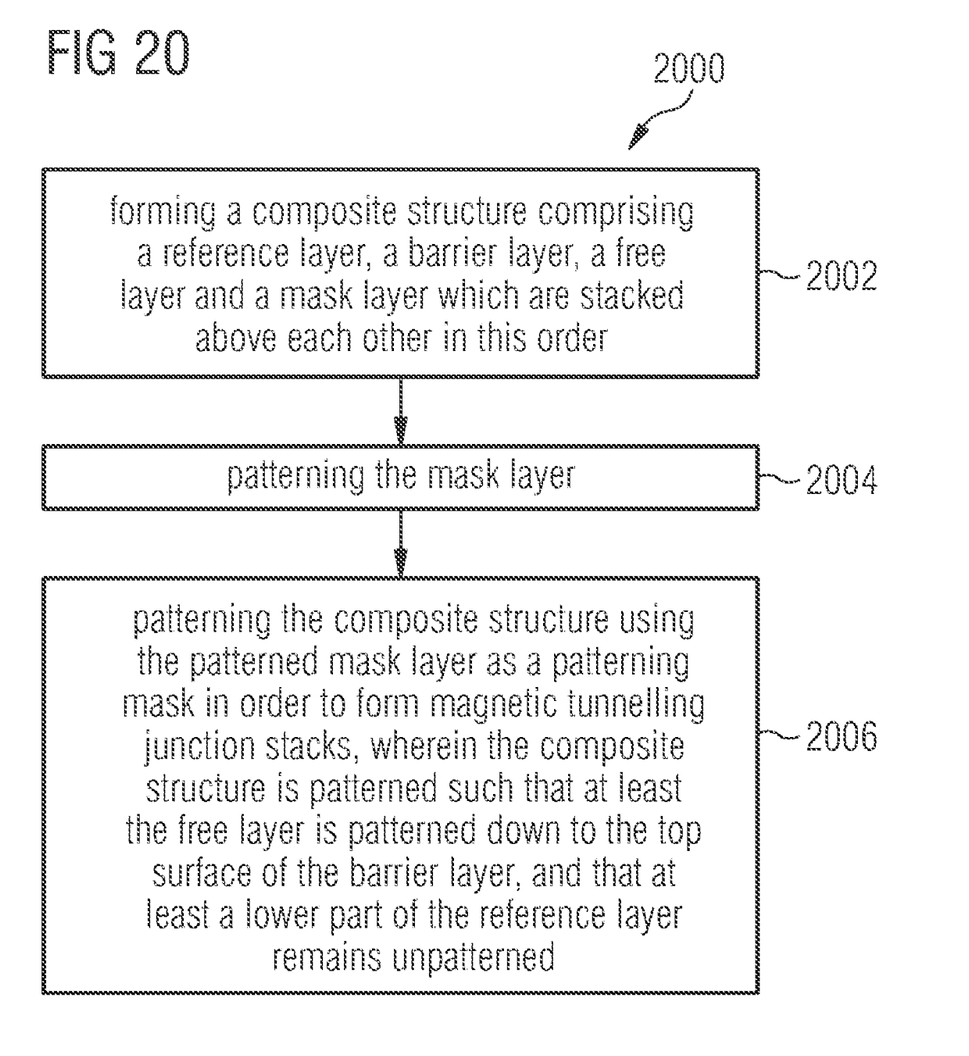
FIG. 20 shows a flow chart of a method of manufacturing an integrated circuit according to one embodiment of the present invention.

FIG. 20 shows a method 2000 of manufacturing an integrated circuit according to one embodiment of the present invention. At 2002, a composite structure is formed including a reference layer, a barrier layer, a free layer and a mask layer which are stacked above each other in this order. At 2004, the mask layer is patterned. At 2006, the composite structure is patterned using the patterned mask layer as a patterning mask in order to form magnetic tunneling junction stacks, wherein the composite structure is patterned such that at least the free layer is patterned down to the top surface of the barrier layer, and that at least a lower part of the reference layer remains unpatterned.

Figure 21:
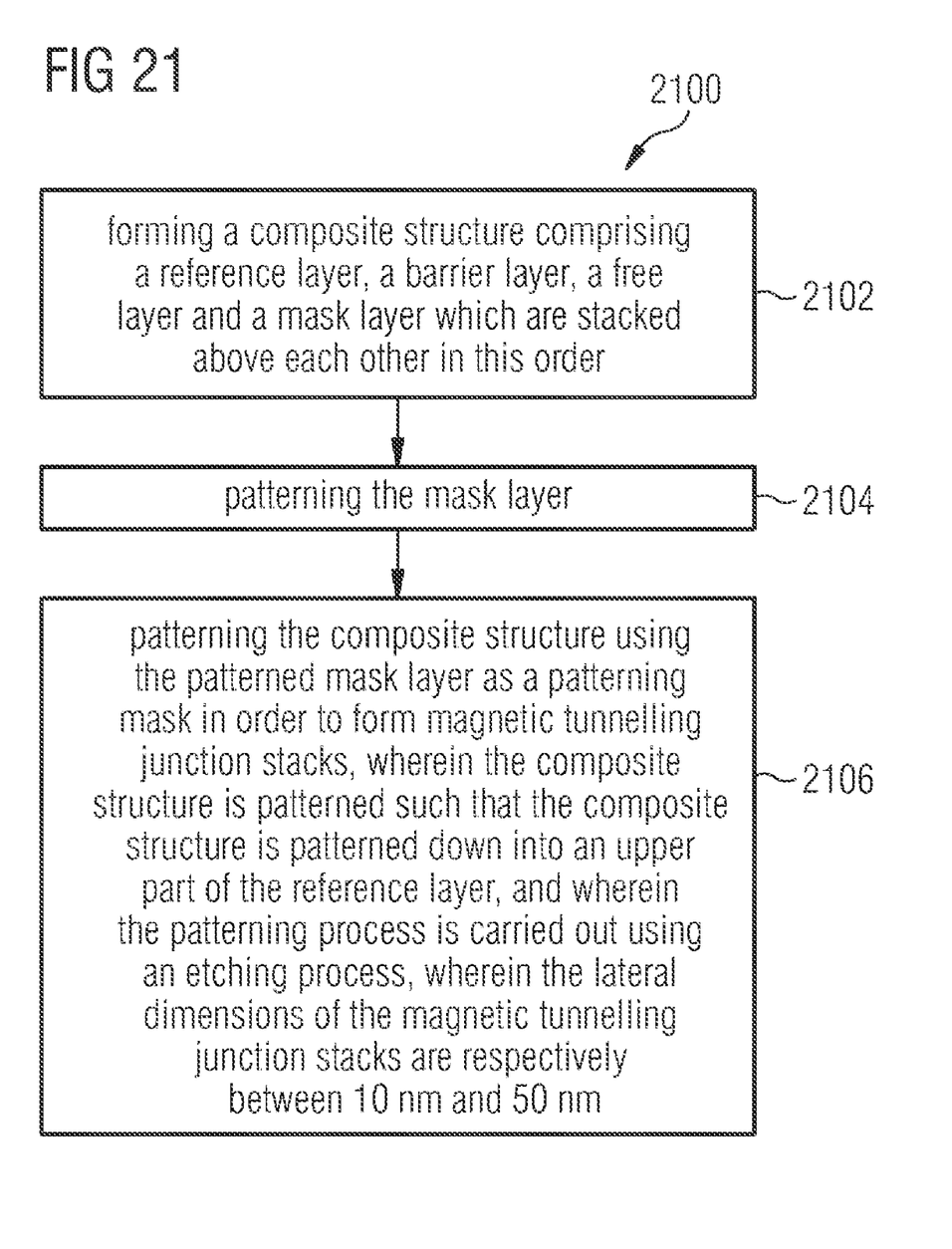
FIG. 21 shows a flow chart of a method of manufacturing an integrated circuit according to one embodiment of the present invention.

FIG. 21 shows a method 2100 of manufacturing an integrated circuit according to one embodiment of the present invention. At 2102, a composite structure is formed including a reference layer, a barrier layer, a free layer and a mask layer which are stacked above each other in this order. At 2104, the mask layer is patterned. At 2106, the composite structure is patterned using the patterned mask layer as a patterning mask in order to form magnetic tunneling junctions stacks, wherein the composite structure is patterned such that the composite structure is patterned down into an upper part of the reference layer, and wherein the patterning process is carried out using an etching process, wherein the lateral dimensions of the magnetic tunneling junction stacks range respectively between 10 nm and 15 nm.

In the following description, further features of embodiments of the present invention will be explained.

NG-MRAM is still considered as one of the most promising DRAM successors. One type of NG-MRAM is based on spin torque switching where a bipolar select current through the MTJ (magnetic tunneling junction) is used for switching the resistance state of the MTJ element. A scaling towards 28 nm node is considered as principally feasible, however, the patterning challenges of 20 to 30 nm wide MTJs need to be overcome.

According to an embodiment of the present invention, a patterning concept for high density MRAM cells with 10 to 50 nm MTJ size is provided.

Conventional solutions provide the following effects: due to a relatively deep etch profile for patterning the MTJ tunnel stacks there is a relatively high risk that the etched products are redeposited along the side walls of the etched structures forming an undefined coating with a high probability to be conductive (i.e., form a shortcut across the insulating barrier). Also the etch product may be redeposited on top of the contacts along the edge, forming so called fences.

Moreover, chemicals being in contact with the sidewalls during etching may react with the material which is not etched away, forming corrosive by-products which will lead to a reduced thermal stability.

According to an embodiment of the present invention, integrated circuits having significantly reduced patterning related damage (fencing, thermal stability, corrosion) are provided. Further, high density cell to cell spacings can be provided due to missing fence products.

According to an embodiment of the present invention, a simple top contact formation is possible According to an embodiment of the present invention, each memory cell comprises a select device for selecting the corresponding memory element.

According to an embodiment of the present invention, a current portion flowing via a current path running through selected cells, and a current portion flowing via a current path running through neighboring cells are mainly determined by the resistive network perpendicular (R_per) and parallel (=in-plane) (R_par) through the reference layer.

According to an embodiment of the present invention, a very low perpendicular barrier resistance R_Bper, and very high parallel reference layer and free layer in-plane resistance R_par enables to route the current predominately through the selected memory cell.

According to an embodiment of the present invention, for a top contact, a common two-dimensional plate, or a one-dimensional bit line can be used. The use of a one-dimensional top contact wiring can reduce cell to cell leakage.

According to an embodiment of the present invention, the magnetic stack between the memory cells can be patterned as follows: 1) partial or full removal of a) free layer, b) free layer and barrier or c) free layer, barrier and reference system, 2) partial or full conversion of a) free layer, b) free layer and barrier or c) free layer, barrier and reference system into a material with substantially higher electrical conductivity, but not necessarily isolating material; or 3) partial or full conversion of magnetic free layer barrier or reference system into a material with substantial reduced magnetic exchange coupling.

According to one embodiment of the present invention, an integrated circuit is provided including a plurality of magnetic tunneling junction stacks, each magnetic tunneling junction stack including a reference layer, a barrier layer and a free layer, wherein the plurality of magnetic tunneling junction stacks share a continuous common reference layer.

According to one embodiment of the present invention, the free layers are laterally separated against each other.

According to one embodiment of the present invention, the magnetic tunneling junction stacks serve as sensors.

According to one embodiment of the present invention, the magnetic tunneling junction stacks serve as memory elements.

According to one embodiment of the present invention, the lateral electrical resistance of the continuous common reference layer between two neighboring magnetic tunneling junction stacks is higher than the vertical electrical resistance between the top surface of the continuous common reference layer and the bottom surface of the continuous common reference layer.

According to one embodiment of the present invention, the continuous common reference layer has a reduced thickness between the magnetic tunneling junction stacks.

According to one embodiment of the present invention, the barrier layers together form a continuous common barrier layer shared by all magnetic tunneling junction stacks.

According to one embodiment of the present invention, the lateral electrical resistance of the continuous common barrier layer between two neighboring magnetic tunneling junction stacks is lower than the vertical electrical resistance between the top surface of a continuous common barrier layer and the bottom surface of the continuous common barrier layer.

According to one embodiment of the present invention, the free layers are laterally separated against each other by a material which is magnetically inactive or only weakly active.

According to one embodiment of the present invention, the free layers are laterally separated against each other by a material having a higher electrical resistance than the free layers.

According to one embodiment of the present invention, each memory cell includes a select device.

According to one embodiment of the present invention, the free layers are electrically connected to a common conductive plate arranged above the magnetic tunneling junction stacks.

According to one embodiment of the present invention, a plurality of free layers is electrically connected to a common conductive line arranged above the magnetic tunneling junction stacks.

According to one embodiment of the present invention, an integrated circuit including a plurality of magneto-resistive memory cells is provided, each memory cell including a reference layer, a barrier layer and a free layer which are stacked above each other in this order, wherein the free layers are laterally separated against each other, and wherein the reference layers together form a continuous common reference layer shared by all memory cells.

According to one embodiment of the present invention, a memory module including at least one integrated circuit comprising a plurality of magneto-resistive memory cells is provided, each memory cell including a reference layer, a barrier layer and a free layer which are stacked above each other in this order, wherein the free layers are laterally separated against each other, and wherein the reference layers together form a continuous common reference layer shared by all memory cells.

According to one embodiment of the present invention, the memory module is stackable.

According to one embodiment of the present invention, a method of manufacturing an integrated circuit is provided, including: forming a composite structure including a reference layer, a barrier layer, a free layer and a mask layer which are stacked above each other in this order; patterning the mask layer; patterning the composite structure using the patterned mask layer as a patterning mask in order to form magnetic tunneling junction stacks, wherein the composite structure is patterned such that at least the free layer is patterned down to the top surface of the barrier layer, and that at least a lower part of the reference layer remains unpatterned.

According to one embodiment of the present invention, the patterning of the composite structure is carried out by removing material of the composite structure.

According to one embodiment of the present invention, the material is removed using an etching process.

According to one embodiment of the present invention, the patterning of the composite structure is carried out by converting the material properties of parts of the composite structure.

According to one embodiment of the present invention, the converting process lowers the magnetic activity of material of the composite structure located between the magnetic tunneling junction stacks to be formed.

According to one embodiment of the present invention, the converting process is carried out using an annealing process, an oxidation process, a nitridation process, or a flouration process.

According to one embodiment of the present invention, the converting process converts parts of the composite structure into silicon oxide.

According to one embodiment of the present invention, the patterning process patterns the composite structure down into an upper part of the reference layer.

According to one embodiment of the present invention, the mask layer is a conductive hard mask layer.

According to one embodiment of the present invention, the lateral dimensions of the magnetic tunneling junction stacks are about 30 nm.

According to one embodiment of the present invention, a method of manufacturing an integrated circuit is provided, including: forming a composite structure comprising a reference layer, a barrier layer, a free layer and a mask layer which are stacked above each other in this order; patterning the mask layer; and patterning the composite structure using the patterned mask layer as a patterning mask in order to form magnetic tunneling junction stacks, wherein the composite structure is patterned such that the composite structure is patterned down into an upper part of the reference layer, and wherein the patterning process is carried out using an etching process, wherein the lateral dimensions of the magnetic tunneling junction stacks are respectively between about 10 nm and about 50 nm.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An integrated circuit, comprimising a plurality of magnetic tunneling junction stacks, each magnetic tunneling junction stack comprising a reference layer, a barrier layer and a free layer, wherein the plurality of magnetic tunneling junction stacks share a continuous common reference layer, wherein the free layers are laterally separated from each other, wherein a lateral electrical resistance of the continuous common reference layer between two neighboring magnetic tunneling junction stacks is higher than a vertical electrical resistance between a top surface of the continuous common reference layer and a bottom surface of the continuous common reference layer.

2. The integrated circuit according to claim 1, wherein the continuous common reference layer has a reduced thickness between the magnetic tunneling junction stacks.

3. The integrated circuit according to claim 1, wherein the barrier layers together form a continuous common barrier layer shared by all magnetic tunneling junction stacks.

4. The integrated circuit according to claim 3, wherein a lateral electrical resistance of the continuous common barrier layer between two neighboring magnetic tunneling junction stacks is lower than a vertical electrical resistance between a top surface of the continuous common barrier layer and a bottom surface of the continuous common barrier layer.

5. The integrated circuit according to claim 1, wherein the free layers are laterally separated from each other by a material that is magnetically inactive or only weakly active.

6. The integrated circuit according to claim 5, wherein the free layers are laterally separated from each other by a material having a higher electrical resistance than the free layers.

7. The integrated circuit according to claim 1, wherein each memory cell comprises a select device.

8. The integrated circuit according to claim 1, wherein the free layers are electrically connected to a common conductive plate arranged above the magnetic tunneling junction stacks.

9. The integrated circuit according to claim 1, wherein a plurality of free layers is electrically connected to a common conductive line arranged above the magnetic tunneling junction stacks.

10. The integrated circuit according to claim 1, wherein the magnetic tunneling junction stacks serve as sensors.

11. The integrated circuit according to claim 1, wherein the magnetic tunneling junction stacks serve as memory elements.

12. A memory module comprising at least one integrated circuit comprising a plurality of magneto-resistive memory cells, each memory cell comprising a reference layer, a barrier layer and a free layer that are stacked above each other in this order, wherein the free layers are laterally separated from each other, wherein the reference layers together form a continuous common reference layer shared by all memory cells, and wherein a lateral electrical resistance of the continuous common reference layer between two neighboring magneto-resistive memory cells is higher than a vertical electrical resistance between a top surface of the continuous common reference layer and a bottom surface of the continuous common reference layer.

13. The memory module according to claim 12, wherein the memory module is stackable.

* * * * *